United States Patent [19]

Ueda

[11] Patent Number: 5,663,783
[45] Date of Patent: Sep. 2, 1997

[54] STAGE-DRIVE CONTROLLING DEVICE, PROJECTION EXPOSURE APPARATUS INCLUDING THE SAME, AND METHOD OF CONTROLLING THE DRIVING OF A STAGE

[75] Inventor: Toshio Ueda, Ohsato-gun, Japan

[73] Assignee: Nikon Corporation, Tokyo, Japan

[21] Appl. No.: 620,531

[22] Filed: Mar. 25, 1996

[30] Foreign Application Priority Data

Jul. 11, 1995 [JP] Japan .................... 7-198182

[51] Int. Cl.$^6$ ................ H01L 21/30; G03B 27/42
[52] U.S. Cl. ................. 355/53; 355/77; 356/27; 356/28.5; 356/399; 356/401
[58] Field of Search ................. 355/53, 71, 77; 359/227, 232, 233, 234, 235; 356/27, 28, 28.5, 400, 401

[56] References Cited

U.S. PATENT DOCUMENTS

| | | | |
|---|---|---|---|
| 5,473,410 | 12/1995 | Nishi | 355/53 |
| 5,477,304 | 12/1995 | Nishi | 355/53 |
| 5,506,684 | 4/1996 | Ota et al. | 356/401 |
| 5,526,093 | 6/1996 | Takahashi | 355/53 |
| 5,528,027 | 6/1996 | Mizutani | 250/234 |

*Primary Examiner*—Arthur T. Grimley
*Assistant Examiner*—Herbert V. Kerner
*Attorney, Agent, or Firm*—Oliff & Berridge

[57] ABSTRACT

In a stage-drive controlling device used in a scanning projection exposure apparatus, a targeted speed Iwy is imparted to a speed control system for controlling the speed of a substrate stage, and a targeted speed Irc is concurrently imparted to a speed control system for controlling the speed of a mask stage such that the two stages assume a predetermined positional relationship. A deviation Xrc in the speed of the Speed control system is multiplied by ¼ (multiplied by the magnification of projection) by a deviation feedback system, and the multiplied value is fed back as a targeted input to the speed control system. For this reason, the following formula holds: $Ywy=\{Kwy/(s+Kwy)\}\times(Yrc/4)$. If the response of the speed control system side (substrate stage side) is good, even if the speed response of the speed control system side (mask stage side) is poor, the speed ratio between the two stages is kept at 4:1.

10 Claims, 6 Drawing Sheets

STAGE-DRIVE CONTROLLING DEVICE, PROJECTION EXPOSURE APPARATUS INCLUDING THE SAME, AND METHOD OF CONTROLLING THE DRIVING OF A STAGE

BACKGROUND OF THE INVENTION

1. Field of the Invention

The present invention relates to a stage-drive controlling device used in a scanning projection exposure apparatus for transferring the pattern of a mask to a. photosensitive substrate via a projection optical system while synchronously scanning a mask stage for holding the mask and a substrate stage for holding the photosensitive substrate in a predetermined scanning direction. More particularly, the present invention concerns a stage-drive controlling device having a characteristic in controlling the speed of the mask stage and the substrate stage.

2. Description of the Related Art

Conventionally, a scanning projection exposure apparatus is known as a kind of exposure apparatus which is used in the manufacture of semiconductor devices, liquid-crystal display devices, and the like through a photolithographic process. In brief, this scanning projection exposure apparatus transfers the pattern of a mask (or reticle) to a photosensitive substrate via a projection optical system while synchronously scanning a mask stage for holding the mask and a substrate stage for holding the photosensitive substrate in a predetermined scanning direction.

The scanning projection exposure apparatus synchronously scans the mask stage and the substrate stage at a speed ratio (4:1) which is determined by the projection magnification of the projection optical system. This synchronous scanning controls the stages by imparting respective targeted values to the speed controlling systems of the respective stages. In this case, a signal representing a difference between the position of the substrate stage and the position of the mask stage is supplied to the speed controlling system of the mask stage. Fox this reason, the signal representing the difference changes when the substrate stage begins to be moved by the speed controlling system on the substrate stage in such a manner as to follow the speed command signal, and the changed signal is supplied to the mask-side speed controlling system so as to accelerate the mask stage in a direction which the difference indicates. The mask-side speed controlling system is a type of controlling system which is generally comprised of a PID controller and the like having an integrating function. The acceleration is effected until the positions of the two stages are aligned, and the mask and the photosensitive substrate are finally scanned synchronously.

However, with the system in which the scanning speed of the mask stage is increased or decreased by detecting the difference between the substrate stage and the mask stage while the substrate stage is moved, there is a drawback in that the time from the acceleration of the mask and the photosensitive substrate until the synchronous scanning becomes long. In particular, as the demand for a larger-size mask (reticle) grows large, the time until the synchronous scanning has become increasingly longer.

Accordingly, from the viewpoint of reducing the time until the synchronous scanning, a stage-drive controlling device has been proposed in which the mask stage is comprised of a relatively large coarsely moving stage and a compact and lightweight finely moving stage which moves relatively over the coarsely moving stage along the scanning direction, as disclosed in U.S. Pat. 5,477,304 corresponding to Japanese Patent Application Laid-Open No. 140,305/1994. In this stage-drive controlling device, the speeds of the coarsely moving stage and the substrate stage are controlled by their respective speed controlling systems at a predetermined speed ratio, and an attempt is made to control the position of the finely moving stage in synchronism with the speed control based on the speed controlling systems of the coarsely moving stage and the substrate stage such that the substrate stage and the finely moving stage assume a predetermined positional relationship.

However, since the speeds of the substrate stage and the coarsely moving stage are controlled independently of each other, strictly speaking, a positional error unfailingly occurs between the two stages. If a disturbance is not present in the two stages, this positional error becomes a fixed value during scanning, so that it suffices if the finely moving stage is capable of coping with a targeted value which does not fluctuate over time during scanning.

FIG. 6 shows an example of the positional error between the coarsely moving stage and the substrate stage during scanning. If the speeds of the Coarsely moving stage and the substrate stage completely coincide with each other from a scanning start, the positional error becomes zero.

In actuality, however, some speed error occurs. In a case where the speed error is present only during acceleration, the positional error waveform becomes such as the one indicated by the chain line A in FIG. 6. The position controlling system of the finely moving stage is the so-called one-type control system which is generally provided with one integrator and an open-loop transfer function has one pole in the origin. If the positional difference between the coarsely moving stage and the substrate stage is a fixed value such as the one indicated by the chain line A, the position controlling system of the finely moving stage is capable of completely absorbing this positional error. However, in a case where when the positional error between the coarsely moving stage and the substrate stage changes in the form of lumps as indicated by the double-dashed line B in FIG. 6, or the positional error changes over time in the form of lumps as indicated by the solid line C and a disturbance of sinusoidal waves, such as the rocking of the body is superposed thereon, the positional controlling system of the finely moving stage which is the one-type control system cannot completely absorb the positional error, and a residual error occurs.

Accordingly, in order to realize high-resolution scanning exposure by using the finely moving stage, it is indispensable to ensure that the lump-like or sinusoidal positional error does not occur between the mask-side coarsely moving stage and the substrate stage, or is minimized as practically as possible.

SUMMARY OF THE INVENTION

The present invention has been devised in view of the above-described circumstances, and its object is to provide a stage-drive controlling device which is capable of minimizing the relative speed error between the substrate stage and the mask stage during scanning.

The stage-drive controlling device in accordance with a first aspect of the present invention is a device which may be used in a scanning projection exposure apparatus for transferring a pattern on a mask onto a photosensitive substrate via a projection optical system while synchronously scanning a mask stage (16, 20) for holding the mask and a substrate stage (12) for holding the photosensitive substrate in a predetermined scanning direction. The stage-drive controlling device is comprised of a second speed control system (2, 34) for controlling the speed of the mask stage (16, 20); a first speed control system (1, 32) for controlling the speed of the substrate stage (12) in synchronous with the speed control of the mask stage (16, 20) such that the substrate stage (12) and the mask stage (16, 20) have a predetermined positional relationship; and a deviation feedback system (46, 48) whereby a value in which a deviation in speed of the second speed control system (34) is multiplied by a speed ratio between the two stages is fed back as a targeted input to the first speed control system (32).

Here, it is assumed that the first speed control system provides better speed response than the second control system. The reason is that, in a deviation feedback system, it is preferred that the deviation in the speed of the speed control system whose speed response is poor be fed back as a targeted input to the speed control system whose speed response is better. According to this feedback control, it is possible to eliminate the relative speed error between the substrate stage and the mask stage during scanning. In other words, even if a fixed positional error, which has occurred until the two stages reach their targeted speeds, is present between the two stages, this positional error can be absorbed completely by a stage-position control system (normally constituted by a one-type control system to prevent the occurrence of instability in the system).

Furthermore, in accordance with a second aspect of the present invention, the mask stage (16, 20) is comprised of a coarsely moving stage (16) capable of moving in the scanning direction and the finely moving stage (20) capable of relatively moving over the coarsely moving stage along the scanning direction while holding the mask. The stage-drive controlling device is comprised of a first speed control system (52) for effecting speed control of the substrate stage on which a wafer is placed; a second speed control system (54) for effecting speed control of the coarsely moving stage; a stage-position control system (56) for controlling the position of the finely moving stage in synchronism with the speed control by the first speed control system and the second speed control system such that the substrate stage and the finely moving stage have a predetermined positional relationship; and a deviation feedback system (46, 48) whereby a value in which a deviation in speed of the second speed control system is multiplied by the reciprocal of a magnification of a projection optical system is fed back as a targeted input to the first speed control system.

Furthermore, in this stage-drive controlling device, the stage-position control system (56) has a speed control loop of the finely moving stage as its internal loop, and a speed difference between the substrate stage and the coarsely moving stage is fed forward as a targeted input of the speed control loop.

First, a description will be given of the operation in accordance With the first aspect of the present invention with reference to the block diagram shown in FIG. 1.

Here, it is assumed that the response on the substrate stage Wy is better than the response on the mask stage Rc. It is further assumed that the magnification of projection of the projection optical system is ¼, and that a target is set to scan the substrate stage Wy at a ¼-fold speed of that of the mask stage Rc.

In the stage-drive controlling device shown in FIG. 1, a targeted speed Iwy is imparted to a first speed control system 1 for controlling the speed of the substrate stage Wy (not shown), and a targeted speed Itc (=4×Iwy) is concurrently imparted to a second speed control system 2 for controlling the speed of the unillustrated mask stage Rc such that the substrate stage Wy and the mask stage Rc assume a predetermined positional relationship. A deviation Xrc in the speed of the second speed control system 2 is multiplied by ¼ (multiplied by the speed ratio between the two stages) by a deviation feedback system 3, and the multiplied value is fed back as a targeted input to the first speed control system 1.

In FIG. 1, a transfer function Yrc/Irc of the second speed control system can be determined from the following Formulae (1) and (2) as shown in Formula (3):

$$Xrc = Irc - Yrc \quad (1)$$

$$Yrc = Krc \times Xrc \times 1/s \quad (2)$$

$$\therefore Yrc/Irc = Krc/(s+Krc) \quad (3)$$

where

Yrc: output of the second speed control system

Krc: speed gain on the mask stage side

If Formula (3) is modified, the following Formula (4) is obtained;

$$Yrc = Krc \times Irc/(s+Krc) \quad (4)$$

By using Formula (4), the input/output relationship of the second speed control system for controlling the speed of the mask stage Rc can be expressed.

Next, the following transfer formulae are calculated for the output of the follow-up side (the first speed control system 1 for controlling the speed of the substrate stage Wy) and the output of the side being followed up (the second speed control system 2 for controlling the speed of the mask stage Rc):

$$Iwy - \tfrac{1}{4} \times (Irc - Yrc) - Ywy = Xwy \quad (5)$$

$$Ywy = Kwy \times Xwy \times 1/s \quad (6)$$

where

Ywy: output from the first speed control system 1

Xwy: speed deviation of the first speed control system

Kwy: speed gain on the substrate stage side

From Formulae (5) and (6) and the relation of Irc=4×Iwy, the transfer function between the output from the second speed control system 2 and the output from the first speed control system 1 can be determined as follows:

$$Ywy = \{Kwy/(s+Kwy)\} \times (Yrc/4) \quad (7)$$

This Formula (7) shows that the output from the first speed control system 1 (substrate stage Wy) side responds to a ¼-fold output from the second speed control system 2 (mask stage Rc) side. From Formula (7) it can be seen that if the response on the follow-up side is good, the output from the follow-up side agrees with the output from the side being followed up, i.e., that the relative speed error between the mask stage Rc and the substrate stage Wy is canceled (even if the speed response on the mask stage side is poor, the speed ratio between the mask stage and the substrate stage is kept at 4:1). Further, if Formula (7) is used, the frequency response necessary for the follow-up side can also be calculated.

Incidentally, in a case where the response of the mask stage side is better than the substrate stage, it suffices if, instead of the deviation feedback system 3 in FIG. 1, a deviation feedback system is provided in which the speed deviation Xwy is multiplied by 4, and the multiplied value is fed back as a targeted input to the second speed control system 2.

Furthermore, in the second aspect of the present invention, a deviation feedback system is provided in which a value in which the speed deviation of the second speed control system is multiplied by the magnification (e.g., multiplied by ¼) of the projection optical system is fed back as the targeted input to the first speed control system. For the same reason as in the coarsely moving aspect of the present invention, the relative speed error between the substrate stage and the coarsely moving stage during scanning can be eliminated. Then, even if a fixed positional error, which has occurred until the two stages reach their targeted speeds, is present between the two stages, this positional error can be absorbed completely by the stage-position control system (normally constituted by a one-type control system.

Furthermore, the stage-position control system has as its internal loop a speed control loop for controlling the speed of the finely moving stage, and the difference in speed between the substrate stage and the coarsely moving stage is fed forward as the targeted input of the speed control loop. Hence, even if a disturbance of sinusoidal waves or the like has occurred, it is possible to minimize the positional error (residual error) between the substrate stage and the coarsely moving stage, which occurs in the case where the stage-position control system is a one-type control system.

The above and other objects, features and advantages of the present invention will become more apparent from the following detailed description of the invention when read in conjunction with the accompanying drawings.

DESCRIPTION OF THE PREFERRED EMBODIMENT

Figure 2:
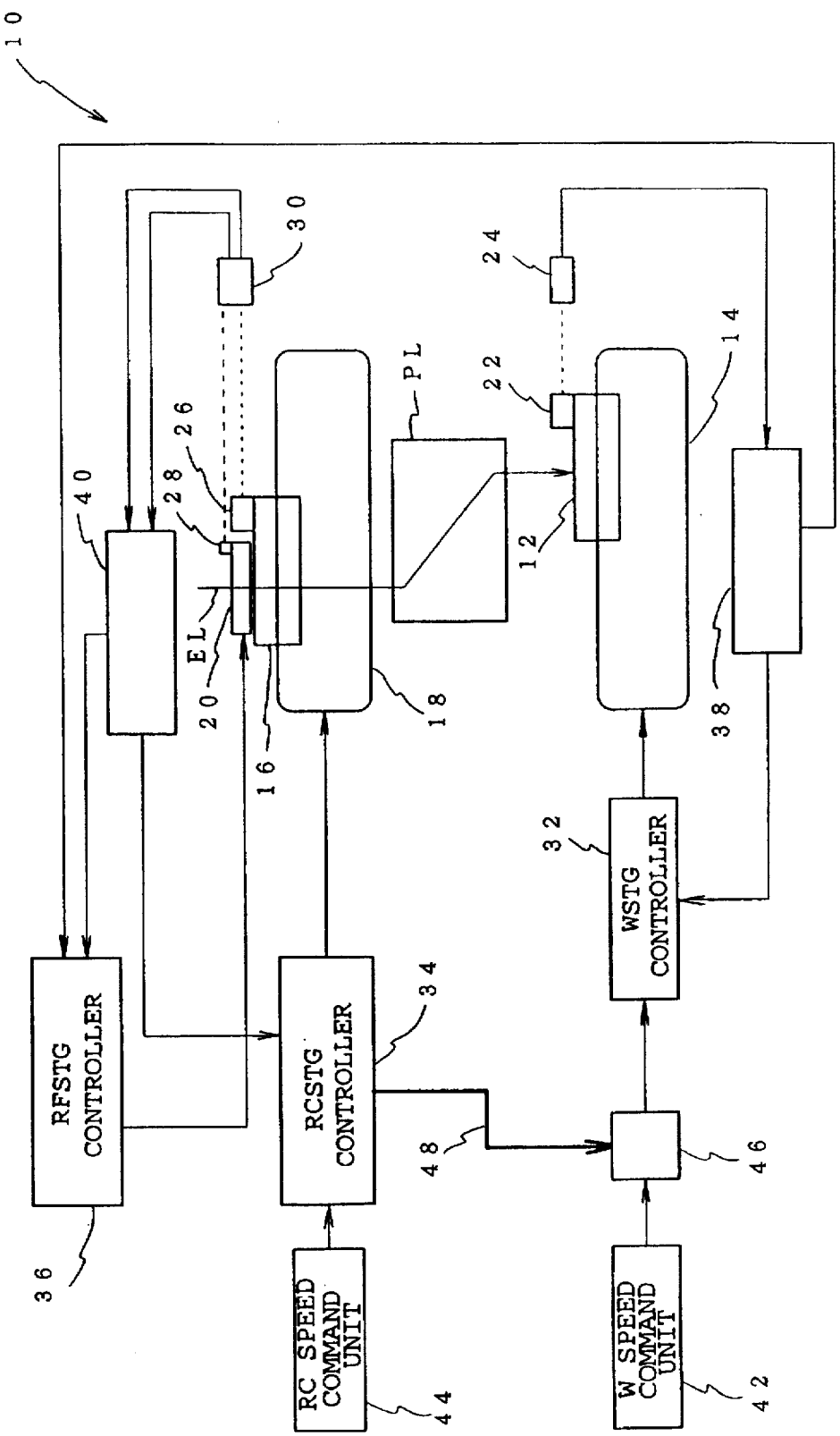
FIG. 2 is a diagram illustrating a configuration of a stage-drive controlling device in accordance with an embodiment of the present invention which is applied to a scanning exposure apparatus.
Figure 3:
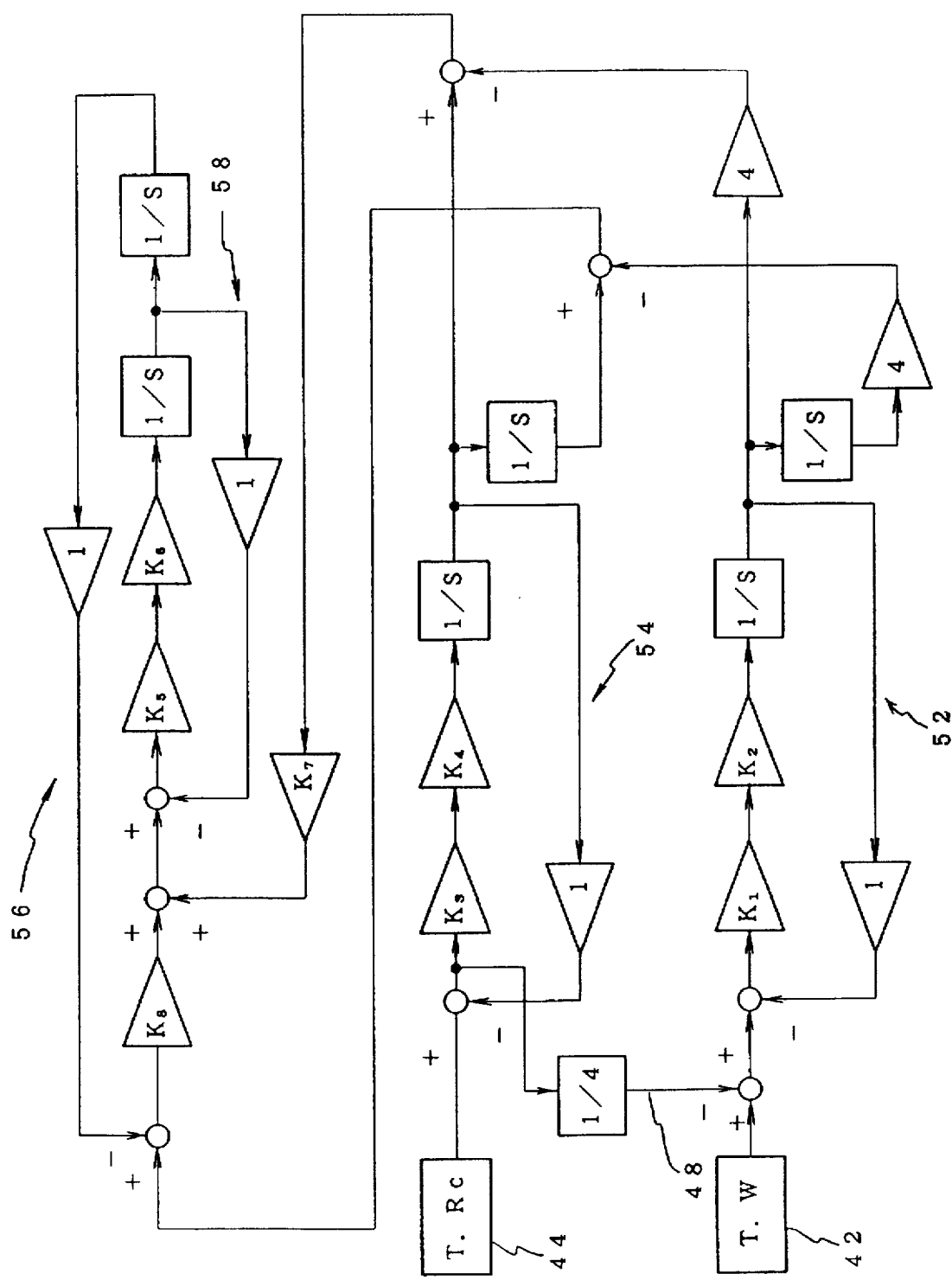
FIG. 3 is a control block diagram corresponding to the stage-drive controlling device shown in FIG. 2.

Referring now to FIGS. 2 to 4, a description will be given of an embodiment of the present invention.

FIG. 2 shows a configuration of a stage-drive controlling device 10 in accordance with the embodiment which is applied to a scanning projection exposure apparatus.

The scanning projection exposure apparatus shown in FIG. 2 is comprised of a wafer stage 12 serving as a substrate stage, a reticle coarsely moving stage herein referred to as the "coarsely moving Stage") 16 which has large size (having a large mass), and reticle finely moving stage (herein referred to as the "finely moving stage") 20 which is a compact (having a small mass).

The wafer stage 12 is disposed on a wafer supporting base (not shown) in such a manner as to be movable in the scanning direction (in the left-and-right direction in FIG. 2) and in a direction perpendicular thereto (in a direction perpendicular to the plane of the drawing in FIG. 2). This wafer stage 12 is driven by a wafer linear motor 14 in the scanning direction, and is driven by an unillustrated linear motor in the direction perpendicular to the scanning direction. However, since the movement of the stage 12 in the direction perpendicular to the scanning direction is not concerned to the present invention, a description of this direction will be omitted. The wafer supporting base is actually disposed on a vibration-proof base (not shown). Incidentally, the device for driving the wafer stage 12 is not confined to the linear motor.

The coarsely moving stage 16 is disposed on an unillustrated reticle supporting base in such a manner as to be movable in the scanning direction (in the left-and-right direction in FIG. 2). This coarsely moving stage 16 is driven by a reticle linear motor 18 in the scanning direction. The aforementioned finely moving stage 20 is disposed over this coarsely moving stage 16 in such a manner as to be movable relative to the coarsely moving stage 16 in the scanning direction. Accordingly, a mask stage is constituted by these two stages. Incidentally, the aforementioned reticle supporting base is actually mounted on unillustrated main-body columns on the vibration-proof base. Detailed structure of the coarsely moving stage 16 and the finely moving stage 20 are disclosed in, for example, Japanese Patent Application Laid-Open No. 140305/1994, the content of which is incorporated by reference.

A projection optical system PL is arranged above the wafer stage 12 such that its optical axis is directed toward a direction perpendicular to the plane of movement of the wafer stage 12, and is held by the unillustrated main-body columns. When a wafer (not shown) is placed on the wafer stage 12, and a reticle (not shown) serving as a mask is placed on the finely moving stage 20, the pattern surface of the reticle and the wafer surface are conjugated with each other with respect to the projection optical system PL. In this embodiment, as the projection optical system PL, one having ¼ magnification of projection is used.

A movable mirror 22 for a wafer laser interferometer is disposed at one end (at the right-hand end in FIG. 2), as viewed in the scanning direction, of the wafer stage 12 in such a manner as to extend in the direction perpendicular to the scanning direction. A wafer laser interferometer 24 is disposed in face-to-face relation to the movable mirror 22. The wafer laser interferometer 24 emits laser light toward the movable mirror 22 and receives reflected light therefrom so as to detect the position of the wafer stage 12.

In a similar manner, first and second movable mirrors 26, 28 for a reticle laser interferometer are disposed at one ends (at the right-hand ends in FIG. 2), as viewed in the scanning direction, of the coarsely moving stage 16 and the finely moving stage 20, respectively, in such a manner as to extend in the direction perpendicular to the scanning direction. A reticle laser interferometer 30 is disposed in face-to-face relation to these movable mirrors 26, 28. The reticle laser interferometer 30 emits laser light toward the movable mirrors 26, 28 and receives the respective reflected light therefrom so as to detect the positions of the coarsely moving stage 16 and the finely moving stage 20, respectively.

The stage-drive controlling device 10 is comprised of the wafer laser interferometer 24, the reticle laser interferometer 30, a wafer stage controller (hereafter referred to as the "WSTG controller") 32 for controlling the speed of the wafer stage 12 by means of the wafer linear motor 14, a reticle coarsely moving stage controller (hereafter referred to as the "RCSTG controller") 34 for controlling the speed of the coarsely moving stage 16 by means of the reticle linear motor 18, a reticle finely moving stage controller (hereafter referred to as the "RFSTG controller") 36 for controlling the position of the finely moving stage 20 by means of an unillustrated driving system, a wafer laser interferometer unit 38, a reticle laser interferometer unit 40, a wafer stage speed command unit (hereafter referred to as the "W speed command unit") 42, and a reticle coarsely moving stage speed command unit (hereafter referred to as the "RC speed command unit") 44.

A signal representing the detected position of the wafer stage 12 from the wafer laser interferometer 24 is inputted to the wafer laser interferometer unit 38, and the wafer laser interferometer unit 38 outputs to the RFSTG controller 36 a position signal in which the signal representing the detected position is multiplied by the reciprocal (in this case, multiplied by 4) of the magnification of the projection optical system PL as well as a signal in which a wafer stage speed signal obtained by differentiating the signal representing the detected position is multiplied by the reciprocal (in this case, multiplied by 4) of the magnification of the projection optical system. At the same time, the wafer laser interferometer unit 38 transmits the wafer stage speed signal to the WSTG controller 32.

A signal representing the detected position of the coarsely moving stage 16 and a signal representing the detected position of the finely moving stage 20 are inputted to the reticle laser interferometer unit 40 from the reticle laser interferometer 30. The reticle laser interferometer unit 40 transmits these detected position signals as the signals representing the positions of the respective stages as they are to the RFSTG controller 36. In addition, the interferometer unit 40 transmits to the RCSTG controller 34 and the RFSTG controller 36 a signal representing the speed of the coarsely moving stage 16 which is obtained by differentiating the signal representing the detected position of the coarsely moving stage 16. Further, the interferometer unit 40 has the function of transmitting to the RFSTG controller 36 a signal representing the speed of the finely moving stage 20 which is obtained by differentiating the signal representing the detected position of the finely moving stage 20.

The RC speed command unit 44 is adapted to transmit a targeted value of the speed of the coarsely moving stage 16 to the RCSTG controller 34.

Furthermore, in this embodiment, an arithmetic unit 46 is interposed between the W speed command unit 42 and the WSTG controller 32, and the RCSTG controller 34 is connected to the arithmetic unit 46 via a communication line 48. This communication line 48 constitutes a deviation feedback system in which the deviation in speed computed by the RCSTG controller 34 (the deviation between the targeted value of the speed of the coarsely moving stage 16 and the signal representing the speed of the coarsely moving stage 16 inputted from the reticle laser interferometer unit 40) is multiplied by the magnification (¼) of the projection optical system PL, and is fed back to the arithmetic unit 46. The difference between the targeted value of the speed from the W speed command unit 42 and the signal fed back by the communication line 48 is outputted from arithmetic unit 46 to the WSTG controller 32 as a targeted value.

FIG. 3 shows one example of a control block diagram corresponding to the stage-drive controlling device 10 configured as described above.

The control system shown in FIG. 3 is largely classified into a first speed control system 52 for controlling the speed of the wafer stage 12, a second speed control system 54 for controlling the speed of the coarsely moving stage 16, and a stage-position control system 56 for controlling the position of the finely moving stage 20 in synchronism with the speed control by the first and second speed control systems 52, 54 such that the wafer stage 12 and the finely moving stage 20 have a predetermined positional relationship.

A difference between the position of the Coarsely moving stage 16, i.e., an integral value of outputs from the second speed control system 54, and a 4-fold value of the position of the wafer stage 12, i.e., an integral value of outputs from the first speed control system 52, is inputted to the stage-position control system 56 as a targeted value of the position of the finely moving stage 20. In practice, the position of the coarsely moving stage 16 and the position of the wafer stage 12 are respectively detected by the laser interferometers 30, 24, and are inputted to the RFSTG controller 36 via the interferometer units 40, 38, respectively, and the speed of the coarsely moving stage 16 and the speed of the wafer stage 12 are not directly detected.

In addition, the stage-position control system 56 is a so-called multiple closed-loop control system which has as its internal loop a speed control loop 58 for controlling the speed of the finely moving stage 20. This speed control loop 58 is constituted by a one-type control system. The difference between the speed of the coarsely moving stage 16, which is an output of the second speed control system 54, and a 4-fold value of the speed of the wafer stage 12, which is an output of the first speed control system 52, is fed forward as the targeted input of this speed control loop 58.

The first speed control system 52 is constituted by a one-type control system, and includes a gain K1 (N/ms$^{-1}$) of conversion from speed to force and a gain K2 (ms$^{-2}$/N) of conversion from force to acceleration. The product of these conversion gains is a loop gain of the first speed control system 52, and corresponds to a gain Kwy in FIG. 1 referred to above.

Similarly, the second speed control system 54 is constituted by a one-type control system, and includes a gain K3 (N/ms$^{-1}$) of conversion from speed to force and a gain K4 (ms$^{-2}$/N) of conversion from force to acceleration. The product of these conversion gains is a loop gain of the second speed control system 54, and corresponds to a gain Krc in FIG. 1 referred to above.

The speed control loop is a one-type control system, and includes a gain K5 (N/ms$^{-1}$) of conversion from speed to force and a gain K6 (ms$^{-2}$/N) of conversion from force to acceleration.

Further, in this embodiment, a value in which the speed deviation of the second speed control system 54 is multiplied by ¼ is fed back as the targeted input to the first speed control system 52 by a deviation feedback system (hereafter referred to as the "deviation feed back system 48") constituted by the aforementioned line 48.

Incidentally, in FIG. 3, a gain K7 denotes a feedforward gain, and a gain K8 denotes a gain of the positional loop of the stage-position control system 56.

Figure 4A:
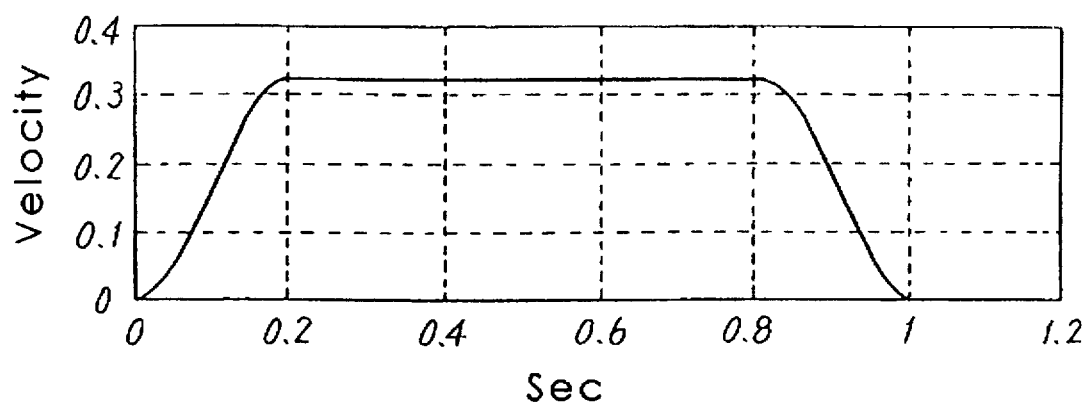
FIG. 4A is a diagram illustrating an example of the profile of a targeted value of the speed of a coarsely moving stage.
Figure 4B:
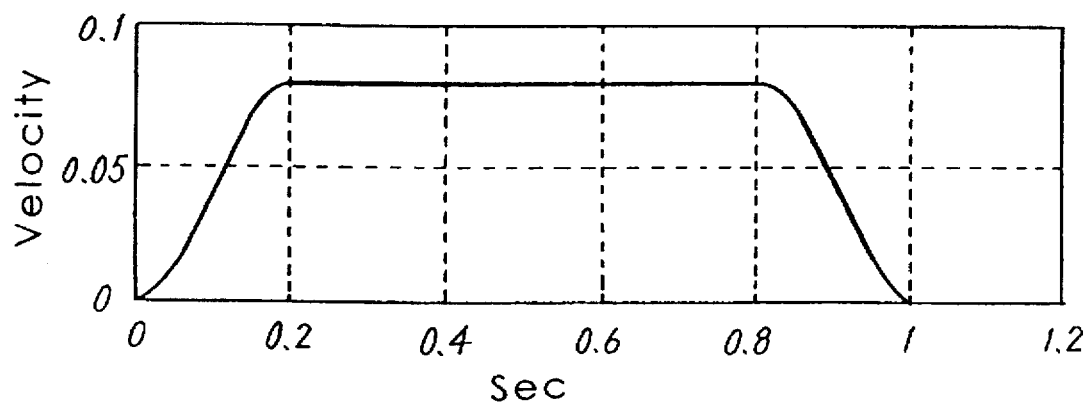
FIG. 4B is a diagram illustrating an example of the profile of a targeted value of the speed of a wafer stage.

According to the stage-drive controlling system 10 in accordance with this embodiment configured as described above, if targeted values of the speed having profiles such as those respectively shown in FIGS. 4A and 4B are inputted to the RC speed command unit 44 and the W speed command unit 42, a transfer function between the output of the second speed control system 54 and the output of the first speed control system 52 can be determined as follows:

$Y_{wy} = \{K_{wy}/(s+K_{wy})\} \times (Y_{rc}/4)$ (7)

This Formula (7) shows that the output from the first speed control system 52 (wafer stage 12) responds to a ¼-fold output from the second speed control system 54 (coarsely moving stage 16). From Formula (7) it can be seen that if the response on the follow-up side is good, the output from the follow-up side agrees with the output from the side being followed up, i.e., that the relative speed error between the coarsely moving stage 16 and the wafer stage 12 is canceled (the speed ratio between the coarsely moving stage 16 and the wafer stage 12 is kept at 4:1).

In other words, the wafer stage (substrate stage). 12 responds to a value in which a value obtained by multiplying the speed deviation of the second speed control system 54, which is computed by the RCSTG controller 34, by ¼ is subtracted from the targeted value of the speed from the W speed command unit 42. Therefore, if the speed response on the wafer stage 12 side is good, the wafer stage 12 completely follows up the coarsely moving stage 16, so that the relative speed error between the two stages 16 and 12 during scanning becomes zero or a very small value. Even if a positional error should occur while the two stages 16 and 12 are being accelerated until reaching the scanning speed (a targeted speed determined in advance by the sensitivity characteristic of a photoresist on the wafer, the intensity of exposure light EL, and the like), the positional error is a substantially fixed value. The finely moving stage 20 is controlled by the RFSTG controller 36 in such a way as to absorb this positional error completely. Thus, it is possible to realize satisfactory scanning exposure using the exposure light EL (see FIG. 2).

In recent years, with respect to the scanning exposure apparatus, there has been a demand for an increase in the exposure area, so that an increase in the size of the reticle as the mask is unavoidable. For this reason, the structure itself of the scanning stage system on the reticle side naturally tends to become large, and the weight of the stage tends to become heavier. In consequence, the natural frequency of the structure declines, which makes it very difficult to secure the speed response on the reticle-side scanning stage.

In such a case, if the control system is configured as in this embodiment, the system as a whole is capable of securing sufficient performance if the wafer stage side satisfies necessary speed response characteristics even if it is impossible to secure the response of the reticle-side scanning stage.

Further, in this embodiment, the difference between the speed of the coarsely moving stage 16, which is an output of the second speed control system, and a 4-fold value of the speed of the wafer stage, which is an output of the first speed control system, is fed forward as the targeted input of the speed control loop 58. Hence, even if a disturbance of sinusoidal waves or the like has occurred, it is possible to minimize the positional error, (residual error) between the wafer stage 12 and the coarsely moving stage 16, which occurs in the case where the stage-position control system 56 is a one-type control system. Incidentally, in a case where it is unnecessary to take the effect of such a disturbance into consideration such as when a high-performance vibration-proof base is used, such feedforward may not necessarily be effected.

Figure 5:
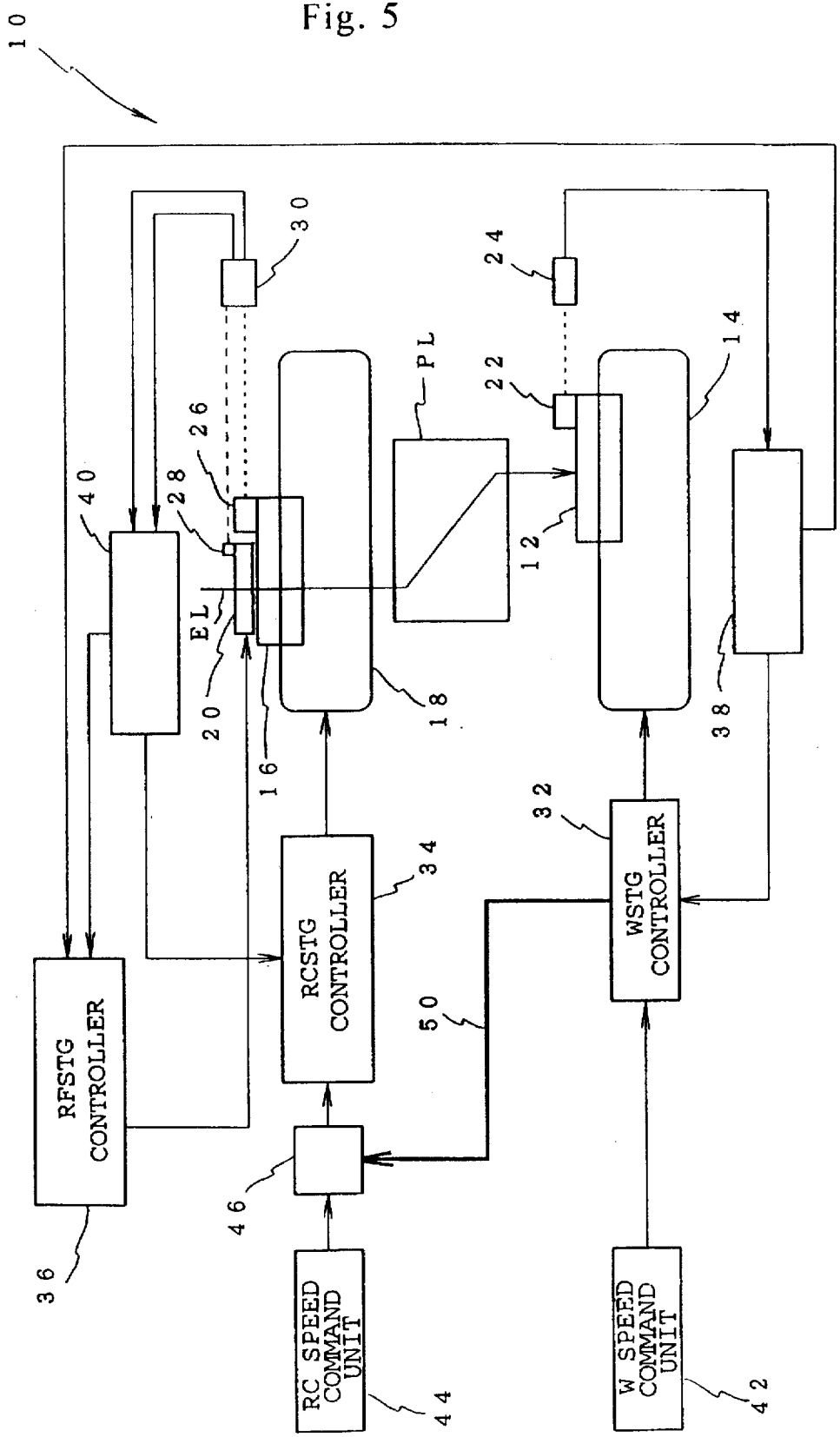
FIG. 5 is a diagram illustrating a configuration of the stage-drive controlling device in accordance with a modification of the present invention.
Figure 6:
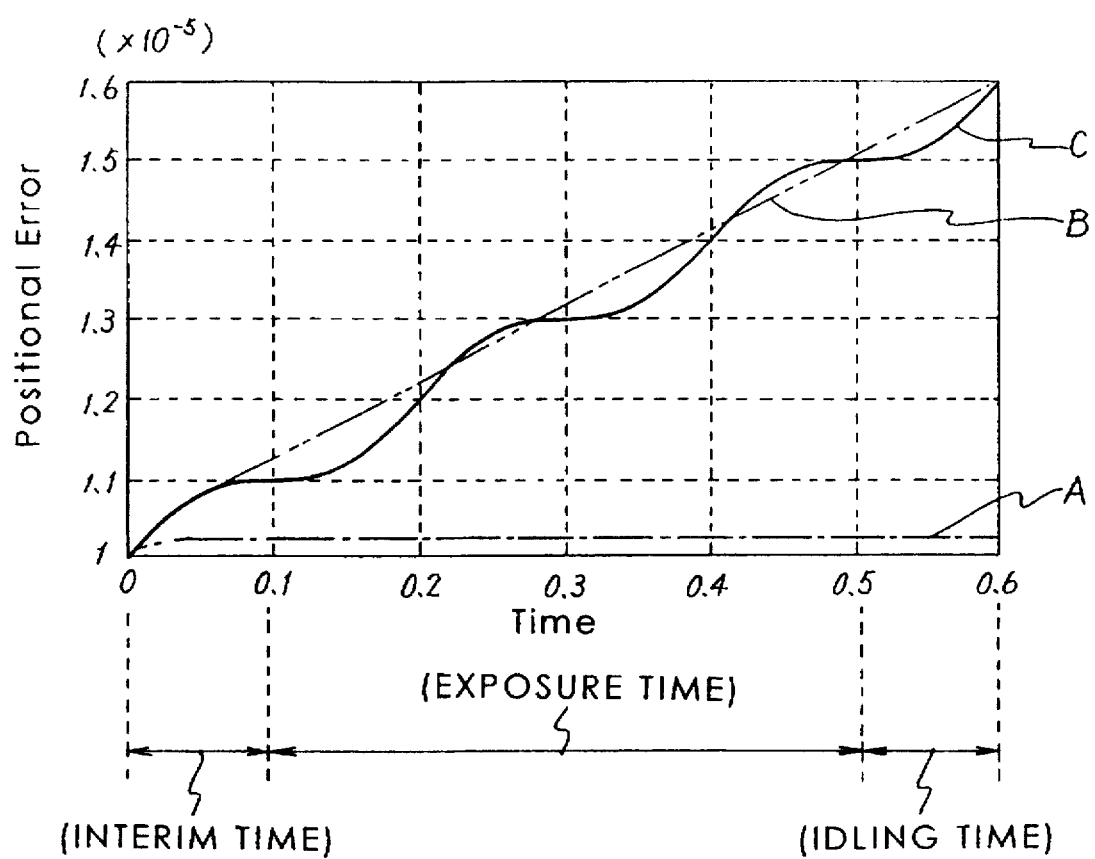
FIG. 6 is a diagram illustrating an example of the positional error between the reticle coarsely moving stage and a substrate stage.

In the above-described embodiment, a description has been given of the configuration in which the speed response of the wafer stage 12 is better than the speed response of the coarsely moving stage 16. However, in a case where the speed response of the coarsely moving stage 16 is better than the speed response of the wafer stage 12, it suffices if a configuration is provided as shown in FIG. 5. In FIG. 5, the arithmetic unit 46 is interposed between the RC speed command unit 44 and the RCSTG controller 34, and instead of the deviation feedback system 48 a deviation feedback system 50 is provided for feeding back to the arithmetic unit 46 a value in which the speed deviation of the first speed control system 52 computed by the WSTG controller 32 is multiplied by the reciprocal (here, multiplied by 4) of the magnification of the projection optical system PL. If such a configuration is adopted, the coarsely moving stage 16 follows up the wafer stage 12, and the relative speed error between the wafer stage 12 and the coarsely moving stage 16 during scanning becomes zero or a very small value for the same reason as the one in the above-described embodiment. The finely moving stage 20 is controlled by the RFSTG controller 36 in such a way as to completely absorb the positional error between the two stages 16 and 12, which occurs while the two stages 16 and 12 are being accelerated until reaching the scanning speed. Thus, it is possible to realize satisfactory scanning exposure using the exposure light EL (see FIG. 2).

Figure 1:
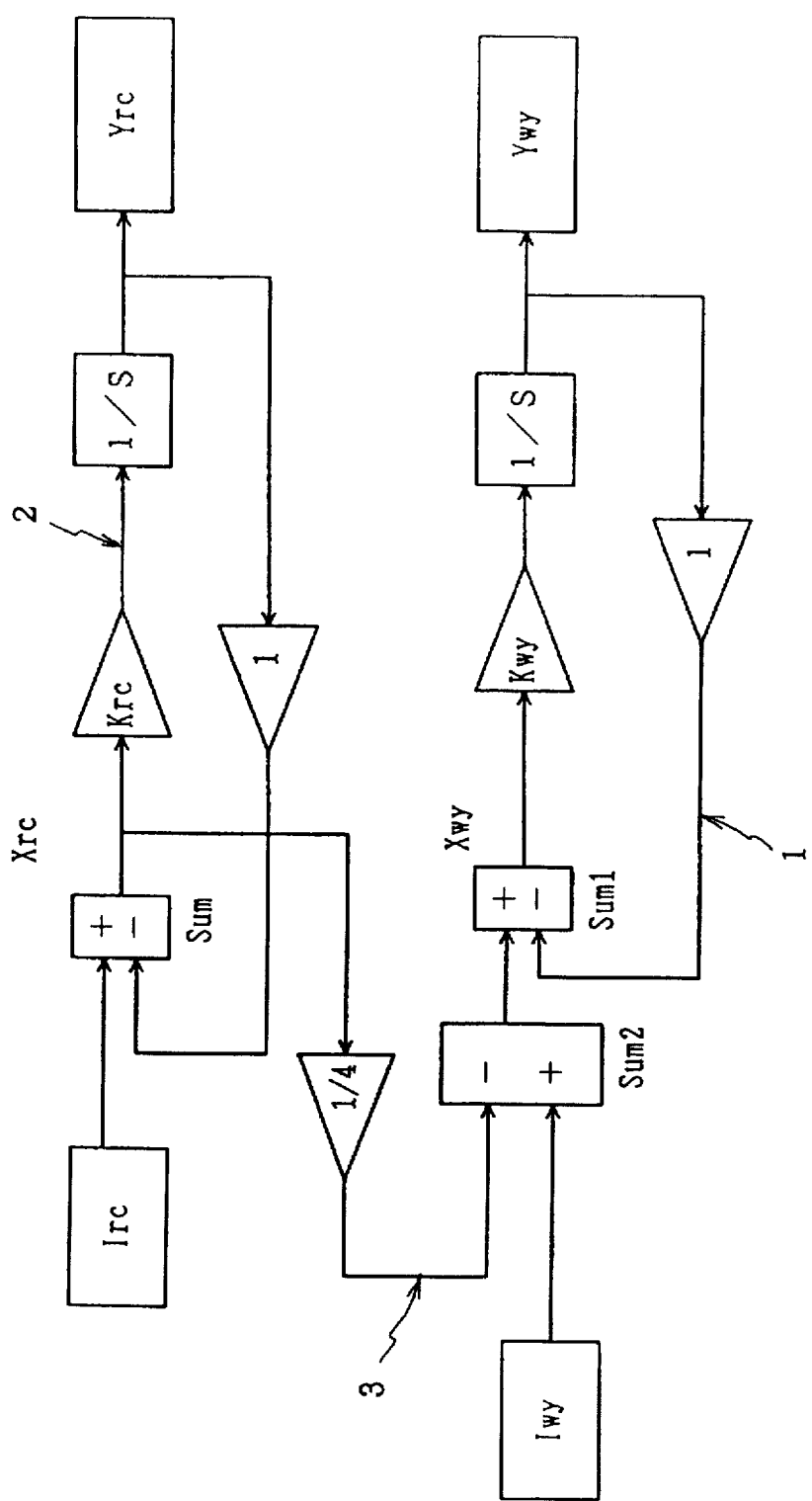
FIG. 1 is a block diagram explaining the operation of the present invention.

While the case in which the present invention is applied to the scanning projection exposure device in which the reticle-side stage (mask stage) is comprised of the coarsely moving stage 16 and the finely moving stage 20 has been described by way of example, the range of application of the present invention is not restricted to the same, and the present invention is applicable to a scanning projection exposure apparatus using a conventional single reticle scanning stage. In such a case, if the response on the wafer stage side is better than that on the mask stage side, it suffices if a control system having a configuration similar to that shown in FIG. 1 is adopted. If, conversely, the response of the mask stage side is better than that on the wafer stage side, it suffices if a configuration is adopted such that, in FIG. 1, instead of the deviation feedback system 3 a deviation feedback system is provided in which the speed deviation of the first speed control system 1 is fed back as a targeted input to the second speed control system 2. In such a configuration as well, if the response on the follow-up side is good, the output on the follow-Up side agrees with the output on the side being followed up, so that the relative speed error between the mask stage and the substrate stage can be canceled.

As described above, in accordance with the present invention, it is possible to obtain an unprecedentedly outstanding advantage in that the relative speed error between the substrate stage and the mask stage during scanning can be minimized.

What is claimed is:

1. A stage-drive controlling device for synchronously scanning a first stage and a second stage in a predetermined scanning direction, comprising:

a first speed control system, which has a speed feedback circuit, for controlling of the first stage;

a second speed control system, which has a speed feedback circuit, for controlling of the second stage in synchronism with the speed control of the first stage; and a deviation feedback system whereby a value in which a deviation between a targeted speed value and a speed feedback value of one of the first speed control system and the second speed control system is multiplied by a speed ratio between said first stage and said second stage and is fed back as a speed correction value, to another one of the first speed control system and the second speed control system.

2. A stage-drive controlling device according to claim 1, further comprising:

a third stage placed over the second stage; and a position control system for effecting positional control of the third stage so as to correct a relative positional error between the first stage and the second stage.

3. A scanning projection exposure apparatus for synchronously scanning a mask and a photo-sensitive substrate in a predetermined scanning direction, comprising:

a mask stage for holding the mask;

a substrate stage for holding the photosensitive substrate;

a first speed control system for effecting speed control of one of said mask stage and said substrate stage;

a second speed control system for effecting speed control of another one of said mask stage and said substrate stage in synchronism with the speed control of said one of said mask stage and said substrate stage such that said mask stage and said substrate stage have a predetermined positional relationship; and a deviation feedback system whereby a value in which a deviation in speed of one of said first speed control system and said second speed control system is multiplied by a speed ratio between said mask stage and said substrate stage and is fed back as a targeted input to another one of said first speed control system and said second speed control system.

4. A scanning projection exposure apparatus for synchronously scanning a mask and a photo-sensitive substrate comprising:

a substrate stage for holding the photosensitive substrate and subjected to scanning;

a coarsely moving stage subjected to scanning in synchronism with said substrate stage; a finely moving stage for relatively moving over said coarsely moving stage while holding the mask;

a first speed control system for effecting speed control of said substrate stage;

a second speed control system for effecting speed control of said coarsely moving stage;

a stage-position control system for controlling the position of said finely moving stage in synchronism with the speed control by said first speed control system and said second speed control system such that said substrate stage and said finely moving stage have a predetermined positional relationship; and a deviation feedback system whereby a value in which a deviation in speed of said second speed control system is multiplied by a speed ratio between said substrate stage and said coarsely moving stage and is fed back as a targeted input to said first speed control system.

5. A scanning projection exposure apparatus according to claim 4, wherein said stage-position control system includes a speed feedback circuit for feeding back the speed of said finely moving stage and a feedforward circuit whereby a position obtained by integrating a difference in speed between said substrate stage and said coarsely moving stage, is fed forward as a targeted input to said stage-position control system.

6. A stage device used in a scanning projection exposure apparatus, comprising:

a substrate stage for holding a photosensitive substrate and subjected to scanning;

a coarsely moving stage subjected to scanning in synchronism with said substrate stage;

a finely moving stage for relatively moving over said coarsely moving stage while holding a mask;

a projection lens for projecting a pattern on said mask onto said photosensitive substrate at a predetermined magnification;

a first speed control circuit for effecting speed control of said substrate stage at a first speed;

a second speed control circuit for effecting speed control of said coarsely moving stage at a second speed obtained by multiplying the first speed by a value equal to the predetermined magnification;

a stage-position control system for controlling the position of said finely moving stage in synchronism with the speed control by said first speed control circuit and said second speed control circuit such that said substrate stage and said finely moving stage have a predetermined positional relationship; and a deviation feedback system whereby a value in which a deviation between a speed outputted from said second speed control circuit and said second speed is multiplied by a value equal to a predetermined magnification of said projection optical system and is fed back as a targeted input to said first speed control circuit.

7. A stage device according to claim 6, wherein said second speed control circuit includes a second targeted speed command unit for commanding a second targeted speed, a second speed feedback circuit for subtracting a speed outputted from said second speed control circuit from a speed outputted said second speed control circuit from said second targeted speed, and an addition/subtraction unit for subtracting a speed outputted from said first speed control circuit from a speed outputted from said second speed control system.

8. A stage-drive controlling device according to claim 7, wherein said first speed control circuit includes a first targeted speed command unit for commanding a first targeted speed, a first speed feedback circuit for subtracting a speed outputted from said first speed control circuit from said first targeted speed, a second addition/subtraction unit for subtracting a deviation of said second speed control circuit from said first targeted speed, and a first addition/subtraction unit for subtracting an output from said first speed control circuit from an output from said second addition/subtraction unit.

9. A stage device according to claim 6, wherein said stage-position control system includes a speed feedback circuit for feeding back the speed of said finely moving stage and a feedforward circuit whereby a position obtained by integrating a difference in speed between said substrate stage and said coarsely moving stage is fed forward as a targeted input to said stage-position control system.

10. A method of controlling the driving of a stage for synchronously scanning a first stage and a second stage in a predetermined scanning direction, comprising the steps of:

controlling the speed of said first stage by speed feedback control;

controlling the speed of said second stage by speed feedback control in synchronism with the speed control of said first stage; and providing feedback in which a value in which a deviation between a targeted speed value and a speed feedback value of one of said first stage and said second stage is multiplied by a speed ratio between said first stage and said second stage and is fed back, as a speed correction value, to another one of said first speed control system and said second speed control system.

* * * * *